United States Patent [19]
Crooks et al.

[11] Patent Number: 5,172,061
[45] Date of Patent: Dec. 15, 1992

[54] Q CONTROL FOR CAPACITIVELY COUPLED MRI/MRSI RF COIL

[75] Inventors: Lawrence E. Crooks, Richmond; Mitsuaki A. Arakawa, Hillsborough, both of Calif.

[73] Assignee: The Regents of the University of California, Oakland, Calif.

[21] Appl. No.: 584,000

[22] Filed: Sep. 18, 1990

[51] Int. Cl.$^5$ .............................................. G01R 33/20
[52] U.S. Cl. ..................................... 324/322; 324/318
[58] Field of Search ............... 324/300, 307, 309, 318, 324/322

[56] References Cited

U.S. PATENT DOCUMENTS

| | | | |
|---|---|---|---|
| 3,204,178 | 8/1965 | Brown et al. | 324/322 |
| 4,095,168 | 6/1978 | Hlavka | 324/322 |
| 4,450,408 | 5/1984 | Tiemann | 324/318 |
| 4,638,253 | 1/1987 | Jaskolski | 324/311 |
| 4,649,348 | 3/1987 | Flugan | 324/318 |
| 4,691,164 | 9/1987 | Haragashira | 324/322 |
| 4,725,779 | 2/1988 | Hyde et al. | 324/318 |
| 4,782,298 | 11/1988 | Arakawa et al. | 324/322 |
| 4,916,398 | 4/1990 | Rath | 324/322 |
| 4,920,318 | 4/1990 | Misic et al. | 324/318 |

OTHER PUBLICATIONS

Kisman et al, "Coupling Scheme and Probe Damper for Pulsed Nuclear Magnetic Resonance Single Coil Probe," Rev. Sci. Instrum., vol. 45, No. 9, Sep., 1974, pp. 1159–1163.
Garroway et al, "Improved Recovery Time in Single Coil Pulsed NMR Spectrometers," Rev. Sci. Instrum., vol. 46, No. 10, Oct., 1975, pp. 1342–1343.
Roeder et al, "A Single-Coil Probe Damper for Pulsed Nuclear Magnetic Resonance," Rev. Sci. Instrum. vol. 42, No. 11, Nov., 1971, pp. 1692–1693.
The Spokas, "Means of Reducing Ringing Times in Pulsed Nuclear Magnetic Resonance," Rev. Sci. Instrum., vol. 36, No. 10, Oct., 1965, pp. 1436–1439.
Andrew et al, "NMR Probe With Short Recovery Time," J. Mag. Res., vol. 73, 1987, pp. 268–276.
Ginzton, E. L., "Resonant-Cavity Characteristics: Measurements of Q" Microwave Measurements, McGraw-Hill, New York, 1957, Chapter 9, pp. 391–434.
Froncisz et al, "Inductive (Flux Linkage) Coupling to Local Coils in Magnetic Resonance Imaging and Spectroscopy", J. Mag. Res., 66, 1986, pp. 135–143.
MacLaughlin, D. E., "Coaxial Cable Attenuation in NMR Sample Coil Circuits", Rev. Sci. Instrum., 60 (10) Oct. 1989, pp. 3242–3248.
Jerosch-Herold et al, "Potential Benefits of a Cryogenically Cooled NMR Probe For Room-Temperature Samples", J. Mag. Res., 85, 1989, pp. 141–146.
Edelstein et al, "Electronic Method for Eliminating Prescan RF Transmitter Amplitude Adjustment", Soc. Mag. Res. in Med., Book of Abstracts, 6th Annual Meeting, Aug. 17–21, 1987.

Primary Examiner—Michael J. Tokar
Attorney, Agent, or Firm—Nixon & Vanderhye

[57] ABSTRACT

The effective Q of a capacitively coupled RF coil in a magnetic resonance imaging (or magnetic resonance spectroscopic imaging) system is controllably lowered from its intrinsic maximum value by controlling the impedance reflected across the coil via a tuning/matching network associated and located with the coil. The Q may be advantageously lowered during transmit time as compared with receive times (during which the Q may be relatively increased) by effecting controlled impedance mismatches within the RF feed network used to supply RF signals to/from the RF coil.

16 Claims, 6 Drawing Sheets

$\beta\lambda$ AND/OR SOURCE IMPEDANCE MISMATCH CHOSEN
TO PRODUCE PROPER $R_a$ IMPEDANCE MISMATCH AT
COIL SITE VIA SMITH CHART ANALYSIS

Q CONTROL FOR CAPACITIVELY COUPLED MRI/MRSI RF COIL

FIELD OF THE INVENTION

This invention relates to the field of magnetic resonance imaging (MRI) utilizing nuclear magnetic resonance (NMR) phenomena and to magnetic resonance spectroscopic imaging (MRSI) sometimes also known as chemical shift imaging (CSI). It is particularly related to a customized Q control for capacitively coupled RF coil(s) useful in MRI and MRSI.

1. Related Patents and Applications

This application is generally related to the following commonly-assigned patents of Crooks et al: U.S. Pat. No. 4,297,637; U.S. Pat. No. 4,318,043; U.S. Pat. No. 4,471,305 and U.S. Pat. No. 4,599,565. These prior issued patents disclose MRI systems which produce images using the spin echo nuclear magnetic resonance phenomenon. It is also generally related to commonly assigned U.S. Pat. No. 4,782,298 issued Nov. 1, 1988 to Arakawa et al and entitled MRI QD RF Coil Having Diode Switched Detuning Circuit Producing Reduced Artifact.

2. Background of the Invention

Magnetic resonance imaging (MRI) is now in wide spread commercial usage. Magnetic resonance spectroscopic imaging (MRSI) is now also emerging from the laboratory. In both types of systems, selected nuclei are excited to nuclear magnetic resonance (NMR) by suitable RF signals transmitted into an object image volume. Resultant NMR RF responses are detected emanating from that same volume and subsequently are processed so as to produce spatial maps of NMR nuclei populations which appear as visual images representing cross-sections through the image volume. Necessary RF signal coupling to/from the image volume is made via tuned RF coils spatially disposed about or substantially adjacent to the image volume. Sometimes a common coil structure is used for both RF signal transmission and reception—and in other instances, separate dedicated RF coil structures are utilized for the transmit and receive phases of the process.

For various reasons, one may wish to control the effective Q of the RF coil(s) to achieve desired results in MRI/MRSI. For example, especially where lower strength magnetic fields are employed (and therefore lower frequency NMR RF signals), the intrinsic Q of the RF coil may be so high as to impair transmission of some NMR RF frequencies during multi-slice procedures. For example, if an RF coil resonant at 2.7 MHz can be caused to have a Q of 100, then its effective bandwidth is approximately 27 KHz and if each slice in a multi-slice procedure requires 1 KHz, then the multi-slice procedure may encompass as many as 27 slices. On the other hand, if an intrinsic higher Q of the coil is allowed to prevail (e.g., 300–400), it may not be possible to service more than about one-third as many slices in a given multi-slice procedure.

At the same time, when NMR RF signals are to be received, a relatively higher Q coil response is preferable because (a) the NMR RF responses in a typical multi-slice procedure occur without a slice selective Z gradient (and thus responses from all slices fall at the same center frequency $f_o$) and/or (b) the NMR RF responses are of low signal amplitude and a higher Q coil enhances the available signal-to-noise ratio of the system.

It is also known that the best signal-to-noise ratio is not always achieved when classic matched impedance maximum power transfer conditions are present. This is because the "noise resistance" of a sensitive RF preamplifier must be taken into account. When the effective noise impedance of the amplifier input is properly matched to the input then the maximum signal-to-noise ratio should be obtained. The ratio of the amplifier's noise voltage to noise current at the amplifier input is typically taken to be the noise impedance and may typically be quite different than the nominal 50 ohm input impedance of many existing preamplifier circuits.

Various prior art techniques for Q control or modification of an NMR RF coil are known. For example, a non-exhaustive collection of some such prior art is listed below (some of which may deal only generally with Q measurement or control rather than being specifically directed toward NMR RF coil applications):

1. Kisman et al, "Coupling Scheme and Probe Damper for Pulsed Nuclear Magnetic Resonance Single Coil Probe," Rev. Sci. Instrum., Vol. 45, No. 9, Sep. 1974, pp 1159–1163.
2. Garroway et al, "Improved Recovery in Single Coil Pulsed NMR Spectrometers," Rev. Sci. Instrum., Vol. 46, No. 10, Oct. 1975, pp 1342–1343.
3. Roeder et al, "A Single-Coil Probe Damper for Pulsed Nuclear Magnetic Resonance," Rev. Sci. Instrum. Vol. 42, No. 11, Nov. 1971, pp 1692–1693.
4. Spokas, "Means of Reducing Ringing Times in Pulsed Nuclear Magnetic Resonance," Rev. Sci. Instrum., Vol. 36, No. 10, Oct. 1965, pp 1436–1439.
5. Andrew et al, "NMR Probe With Short Recovery Time," J. Mag. Res., Vol. 73, 1987, pp 268–276.
6. Ginzton, E. L., "Resonant-Cavity Characteristics: Measurement of Q", Microwave Measurements, McGraw-Hill, New York, 1957, Chapter 9, pp 391–434.
7. Froncisz et al, "Inductive (Flux Linkage) Coupling to Local Coils in Magnetic Resonance Imaging and Spectroscopy", J. Mag. Res., 66, 1986, pp 135–143.
8. MacLaughlin, D. E., "Coaxial Cable Attenuation in NMR Sample Coil Circuits", Rev. Sci. Instrum., 60 (10) Oct. 1989, pp 3242–3248.
9. Jerosch-Herold et al, "Potential Benefits of a Cryogenically Cooled NMR Probe For Room-Temperature Samples", J. Mag. Res., 85, 1989, pp 141–146.

U.S. Pat. No. 3,204,178—Brown et al (1965)
U.S. Pat. No. 4,450,408—Tiemann (1984)
U.S. Pat. No. 4,649,348—Flugan (1987)
U.S. Pat. No. 4,691,164—Haragashira (1987)
U.S. Pat. No. 4,725,779—Hyde et al (1988)

The Kismann et al, Garroway et al, Roeder et al, Spokas, and Andrew et al articles all deal with traditional (i.e., non-imaging) NMR spectrometers which utilize the NMR FID signal which begins to occur immediately after cessation of the RF transmit pulse. Since sensitive RF receiving circuitry cannot begin to see the small amplitude NMR RF FID response until the transmit signal has finished "ringing" in the RF coil circuits (which are typically used for both transmit and receive purposes), these references all teach various sorts of schemes for temporarily damping or lowering the Q of the RF coil for a few microseconds immediately after the transmit pulse has been turned off. Typically, controllably biased PIN diodes are used in various sorts of clamping or de-Qing circuits with precisely controlled PIN biasing pulses being used to de-Q the coil for a few microseconds at the appropriate time.

Brown et al is also directed to a conventional (i.e., non-imaging) NMR spectroscopic application albeit in the context of a well logging application. Here, a thyrite resistor is permanently connected across an electromagnetic coil so as to vary the effective Q of the coil as a function of the voltage magnitude present across the coil terminals. Additional damping resistance is switch connected prior to reception time (at which time the resistance is disconnected and the Q of the coil is permitted to move toward its intrinsic value). However, there is no impedance matching network associated with the coil nor is there discussion of transmission lines interconnecting the coil with other transmit/receive circuits, etc.

Tiemann teaches the use of a multi-pole impedance transforming band-pass filter network for matching the high input impedance of an NMR receiver to the low impedance of a pick-up coil per se thus effectively de-Qing the coil to some degree (typically a factor of two) during NMR signal reception. In effect, the input impedance of a receiver circuit is reflected through the matching circuit so as to appear in parallel across the RF signal coil. It appears that the capacitance/inductance of an interconnected coaxial transmission line is effectively included as part of the multi-pole impedance transforming network and it does not appear that the coil has any tuning/matching circuitry associated thereat.

Flugan also recognizes the need to control Q of various NMR coils within an MRI system. Although separate receiving and transmit coils appear to be utilized so as to achieve some of the desired control over coil Q associated with the transmit and receive functions, he also teaches the use of "detuning resistors" connected across selected ones of the coils so as to "spoil" the coil Q such as may be desired to achieve broader bandwidth during multi-slice imaging. Some existing MRI systems also utilize a switched resistor at the coil to selectively de-Q the coil.

Haragashira teaches a typical tuning circuit for a receiver coil which permits maintenance of a "high" Q during reception time by, among other things, retaining a matched impedance condition with a transmission line and using a local electrically controllable variable capacitor for tuning of the coil. They consider that the capacitance of the coax cable is added to a fixed matching capacitor, whose value is predetermined to add to the capacitance of the known length of cable.

Hyde et al teaches a special receive-coil structure which includes passive back-to-back diodes connected so as to automatically lower the Q and change the net coil inductance to further decouple the receive coil from the transmit coil during transmit processes.

Ginzton has several chapters on measuring loss of resonant cavities. Chapter 9 specifically addresses Q measurement. All the coupling models are inductive loops. Loops were frequently used but he also mentions iris couplings. FIG. 9.3 shows a coupled model with a transmission line matched to a generator. The length of the transmission line is variable. On page 393 he defines loaded, unloaded and external Q. On page 396 he derives the equation for loaded Q. He then mentions three conditions, critically coupled, undercoupled and overcoupled. When Ginzton's beta term is 1, the loaded Q is half the unloaded Q. He does not mention that the other two cases have high Q and low Q. This is, however, clear later in the chapter (especially in his "Q circles"). He also calculates the transformation of impedance at the end of the transmission line as line length changes. It should be noted that there is no suggestion by Ginzton to use such techniques to actively control the Q of NMR RF coil structures.

Froncisz et al describe inductive matching to RF coils for MRS & MRI in "Inductive (Flux Linkage) Coupling to Local Coils in Magnetic Resonance Imaging and Spectroscopy." They concentrate on inductive matching to optimize power transfer. As such the over and undercoupled cases did not not interest them. They do show examples of the impedance curves for all three cases in FIG. 3. On page 136 they mention that their experience is with inductive coupling and "We are therefore not able to make a definitive comparison of divider-type matching schemes and flux-linkage schemes." By divider-type matching they mean conventional capacitive coupler matching circuits.

MacLaughlin in "Coaxial Cable Attenuation in NMR Sample Coil Circuits" has such a capacitive match circuit. MacLaughlin's concern is the effect of lossy coax on system performance. He develops some impedance and Q equations. For the non-matched case (his resonant-coax scheme) he is interested in a coil that has no loss (with an extension to small loss). For his other cases he is matched or close to it. His goal is to minimize loss associated with use of lossy coax.

Jerosch-Herold et al in "Potential Benefits of a Cryogenically Cooled NMR Probe for Room-Temperature Samples" consider matching a cold probe with a warm sample to an amplifier. They stay in the matched condition where the Q is half the value it would be without the amplifier connected. They calculate noise when the sample, coil and amplifier are all at different temperatures.

BRIEF SUMMARY OF THE INVENTION

Although the general need for Q control of RF coils in various types of NMR systems is thus generally recognized for various purposes, we have discovered a particularly convenient and novel technique for achieving such Q control over RF coils having conventional capacitively coupled tuning and impedance matching circuits located thereat in an MRI/MRSI system. In brief, whereas matched impedance terminations with interconnecting transmission lines and transmit/receive circuits have generally been used in the past, we have discovered that merely introducing a proper impedance mismatch in the RF coupling circuits can be used to indirectly impose a controlled value of load resistance across the RF coil and thereby control its Q.

For example, a typical RF coil tuning and matching circuit is dimensioned so as to provide a nominal 50 ohm input/output impedance for coupling to a conventional coaxial cable having a nominal characteristic impedance of 50 ohms. At the other end of the coaxial cable, conventional matching networks are typically used so as to effectively produce an RF transmitter/receiver source impedance of 50 ohms as well. In such matched impedance circuits, the effective Q of the coil is automatically lowered to about half what it would otherwise be (i.e., its intrinsic value).

However, by introducing an impedance mismatch in such a circuit, the effective Q of the coil can be either increased or decreased about this nominal Q/2 value. The impedance mismatch may be effected remotely from the coil (e.g., at the site of the RF transmitter and/or receiver circuits) or at the coil site itself (e.g., by purposefully "matching" the coil to an impedance different from the effective source impedance presented to the coil via the transmission line circuits).

These as well as other objects and advantages of this invention will be more completely understood and appreciated by careful reading of the following detailed description of the presently preferred exemplary embodiments of this invention in conjunction with the accompanying figures, of which:

DETAILED DESCRIPTION OF PRESENTLY PREFERRED EXEMPLARY EMBODIMENT

Figure 1:
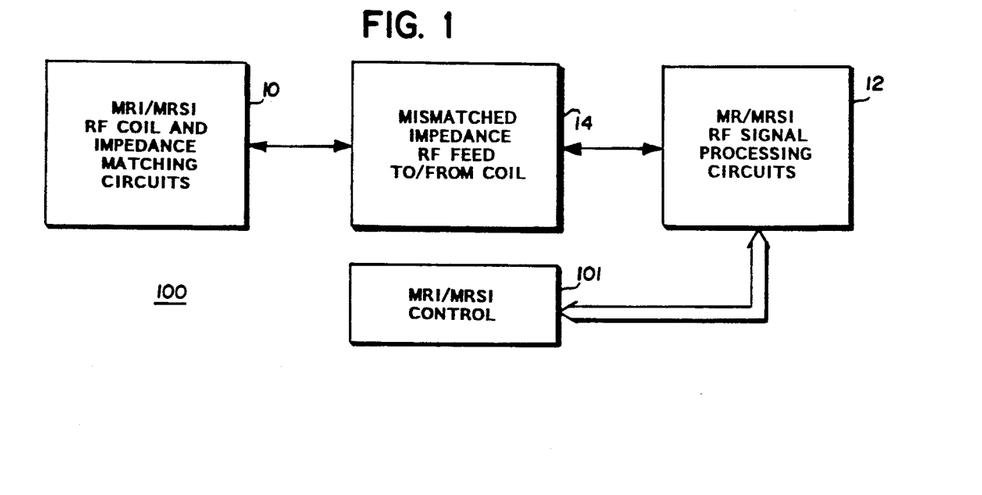
FIG. 1 is a block schematic diagram of an exemplary embodiment of this invention.

As shown in FIG. 1, conventional MRI/MRSI systems 100 include control circuits 101, RF signal processing circuits 12 communicating via transmission lines 14 with RF coils 10 (typically including capacitively coupled tuning and impedance matching circuits located thereat so as to tune the RF coil to a desired resonant frequency and to match it to a desired characteristic impedance, typically equal to the nominal characteristic impedance of RF transmission line 14).

The RF coil with its tuning and matching circuits 10 is typically located in close proximity to an image volume within a large and complex arrangement of magnets, magnetic gradient coils, etc. This assemblage (including the RF coils and their RF tuning/matching circuits) typically is located inside a screened room and remote from RF transmit/receive circuits 12 utilized for actually processing the NMR RF signals of the MRI/MRSI system. However, in FIG. 1, the remotely located MRI/MRSI signal processing circuits 12 are shown as interconnected via a purposefully mismatched impedance RF feed 14 coupled between the RF signal processing circuits 12 and the MRI/MRSI RF coil matching circuits 10.

There are many specific types of RF coil structures and of RF capacitively coupled tuning and matching circuits normally associated with the coil. Sometimes balanced capacitive coupling is used and sometimes unbalanced capacitive coupling is used. Typically, a parallel capacitor is used (perhaps in conjunction with distributed serial capacitance) to achieve resonance at the desired RF frequency, while one or more serial (variable) capacitors are used to achieve impedance matching with the characteristic impedance of RF transmission line (e.g., 50 ohms).

Figure 2:
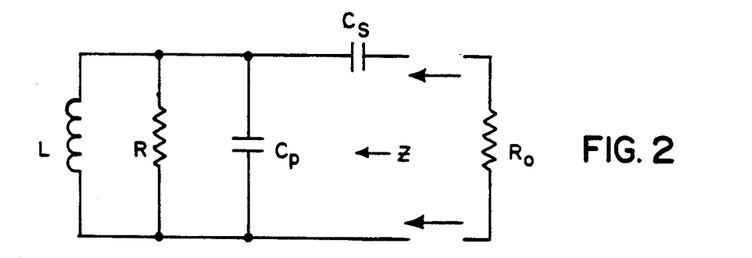
FIG. 2 is a schematic diagram of one type of RF coil/tuning/matching circuit useful in calculating matched impedance parameter values.

To make calculations more straight forward, it may be assumed that the coil/tuning/matching circuits reduce to the equivalent circuit depicted in FIG. 2. Here, the impedance Z seen looking into the circuit (as depicted by arrows) can be written as:

$$Z = \frac{1}{\frac{1}{jwL} + \frac{1}{R} + jwC_p} + \frac{1}{jwC_s} \quad \text{(Equation 1)}$$

where w is frequency in radians/sec and $j=\sqrt{-1}$.

After algebraic manipulation and setting of the imaginary part to zero (for resonance), one can solve for:

$$C_s = \frac{L}{R^2(1 - w^2LC_p)} + \frac{(1 - w^2LC_p)}{w^2L} \quad \text{(Equation 2)}$$

If a matched impedance termination to $R_o$ is to be made, one can also set the real part of Z equal to $R_o$ and thereby derive the following substitution quantity:

$$(1 - w^2LC_p) = \frac{wL\sqrt{(R/R_o - 1)}}{R} \quad \text{(Equation 3)}$$

Using these relationships, it can be shown that:

$$C_p = \frac{1}{w^2L}\left[1 - \frac{wL\sqrt{(R/R_o - 1)}}{R}\right] \quad \text{(Equation 4)}$$

$$C_s = \frac{1}{w\sqrt{(R_o(R - R_o))}} \quad \text{(Equation 5)}$$

Figure 3:
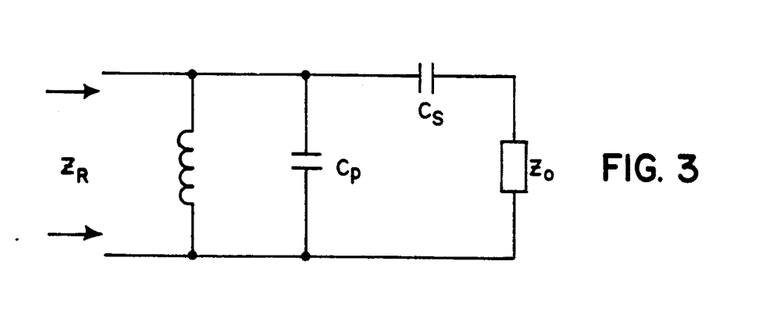
FIG. 3 is a schematic diagram of the type of circuit shown in FIG. 2 but arranged so as to be useful in calculating the effective parallel impedance imposed indirectly across the coil by a mismatched impedance termination.

Now, assuming that the circuit is terminated in an impedance $Z_o$ (as shown in FIG. 3), what is the effective parallel resistance indirectly imposed back through the tuning/coupling circuit across the coil? This indirectly imposed impedance Z can be written down from the FIG. 3 equivalent circuit as:

$$Z = \frac{1}{\frac{1}{\frac{1}{jwC_s} + Z_o} + jwC_p + \frac{1}{jwL}} \quad \text{(Equation 6)}$$

By various manipulations and substitutions, it can be shown that this reduces to:

$$Z = \frac{R^2R_oZ_o + jR(\sqrt{(R_o(R - R_o))})\ (Z_o^2 - R_o^2)}{(R - R_o)Z_o^2 + R_o^3} \quad \text{(Equation 7)}$$

From this, it can be seen that the real part of Z:

$$\text{Real } Z = \frac{R^2R_oZ_o}{(R - R_o)Z_o^2 + R_o^3} \quad \text{(Equation 8)}$$

If impedance mismatch factor k is defined as:

$$k = Z_o/R_o \quad \text{(Equation 9)}$$

then $$\text{Real } Z = \frac{R}{k - ((k^2 - 1)/k)R_o/R} \quad \text{(Equation 10)}$$

$$\text{Imag } Z = \frac{jR(\sqrt{(R_o(R - R_o))})(k^2 - 1)}{k^2 - (k^2 - 1)R_o/R} \quad \text{(Equation 11)}$$

Note that the intrinsic Z of the coil, i.e. with no connection to the receiver or transmitter systems, is $Q = R/wL$. Once the receiver or transmitter is connected and matched the total resistance across the coil is R in parallel with the real part of Z. This is:

$$R_{total} = \frac{R}{k + 1 - ((k^2 - 1)/k)R_o/R} \quad \text{(Equation 12)}$$

With the receiver or transmitter attached to the coil via the matching network the coil Q is reduced to $Q' = R_{total}/wL$. Using the definition of intrinsic Z above combined with equation 12 gives the coil Q' value as:

$$Q' = Q \frac{1}{k + 1 - ((k^2 - 1)/k)R_o/R)} \quad \text{(Equation 13)}$$

When $R_o$ is matched, Q is half the unloaded value. When $R_o$ is either zero or infinite it dissipates no energy. Then only R is acting and coil Q is at the unloaded value. For example, consider the case where $R_o$ is infinite, an open circuit. The coil has only R to load it but $C_s$ is disconnected so the resonant frequency has changed substantially. At the correct resonant frequency the real impedance across L is just R. So the Q variation derived from Equation 13 using the real impedance at $f_o$ is only valid for small changes of resonant frequency. One can drive the Q down some by increasing $R_o$ but when the frequency starts to change too much the Q increases again.

Computer simulations were run to find the resonant frequency, real impedance and bandwidth of the FIG. 2 circuit for a wide range of termination resistor (or k) values. (Note that the relation $f_o/3$ db bandwidth $= Q$ does not work for Qs less than 10.) The simulated circuit used the following parameters: $f_o = 15$ MHz, L=1 $\mu$H, R=10,000 $\Omega$, $C_p$=97.6 pf, $C_s$=15.0 pf. Table 1 shows the results for terminating resistance from 0.01 to 9900 $\Omega$:

TABLE 1

| $R_o$ | $Z_{real}$ | Center f | −3db Low f | −3db High f | Δ | Q |
|---|---|---|---|---|---|---|
| 0.01 | 9996 | 14.99 | 14.92 | 15.06 | .14 | 107 |
| 0.05 | 9989 | 14.99 | 14.92 | 15.06 | .14 | 107 |
| 0.1 | 9979 | 14.99 | 14.92 | 15.06 | .14 | 107 |
| 0.5 | 9900 | 14.99 | 14.92 | 15.06 | .14 | 107 |
| 1.0 | 9802 | 14.99 | 14.92 | 15.06 | .14 | 107 |
| 5.0 | 9087 | 14.99 | 14.915 | 15.07 | .155 | 96.7 |
| 25 | 6659 | 14.99 | 14.89 | 15.10 | .21 | 71.4 |
| 50 | 4997 | 14.995 | 14.855 | 15.14 | .285 | 52.6 |
| 75 | 4013 | 15.00 | 14.825 | 15.18 | .355 | 42.2 |
| 100 | 3362 | 15.005 | 14.8 | 15.22 | .420 | 35.7 |
| 200 | 2105 | 15.055 | 14.72 | 15.41 | .690 | 21.8 |
| 500 | 1268 | 15.33 | 14.73 | 15.94 | 1.210 | 12.6 |
| 1000 | 1268 | 15.72 | 15.10 | 16.38 | 1.280 | 12.2 |
| 5000 | 3372 | 16.09 | 15.85 | 16.33 | .480 | 33.5 |
| 10000 | 5009 | 16.11 | 15.94 | 16.27 | .330 | 48.8 |
| 50000 | 8333 | 16.11 | 16.01 | 16.21 | .200 | 80.5 |
| 99000 | 9082 | 16.11 | 16.02 | 16.20 | .180 | 89.5 |

Figure 4:
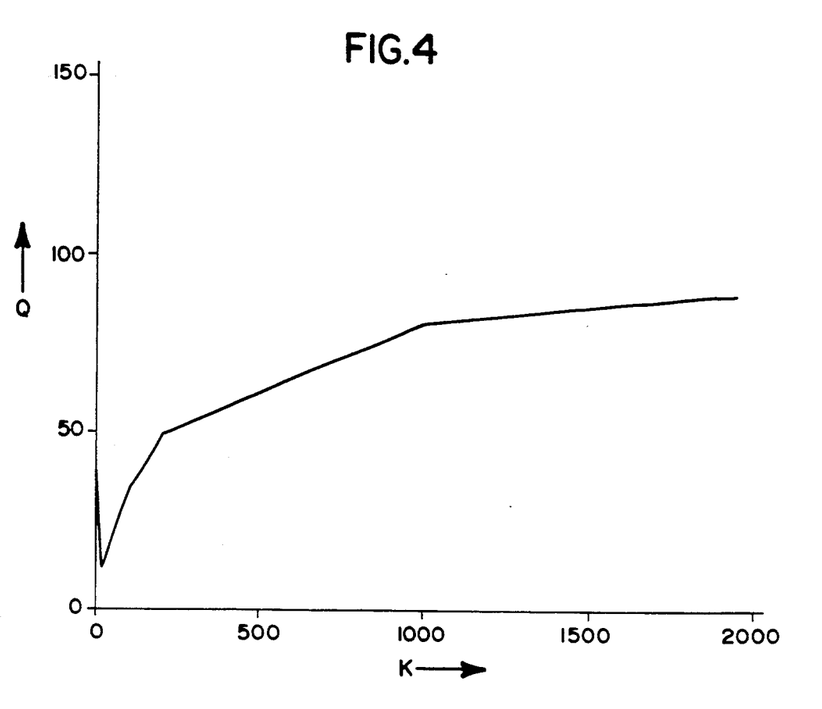
FIGS. 4-5 are plots of the Q for the FIG. 2 circuit as a function of an impedance mismatch factor k.
Figure 5:
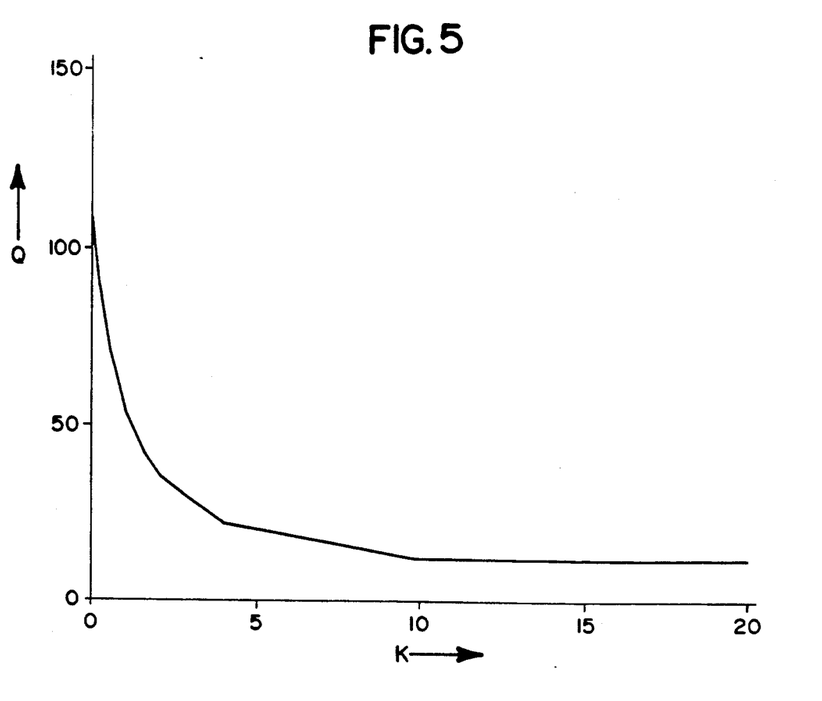

The minimum Q is 12.2 when k=20. This is about 1/9th the unloaded Q. FIGS. 4 and 5 plot Q versus k for two ranges of k for the circuit of FIG. 2. Note that Q is calculated as $(f_o)/\Delta$ since the bandwidth Δ is interesting for multi-slice imaging.

Figure 6:
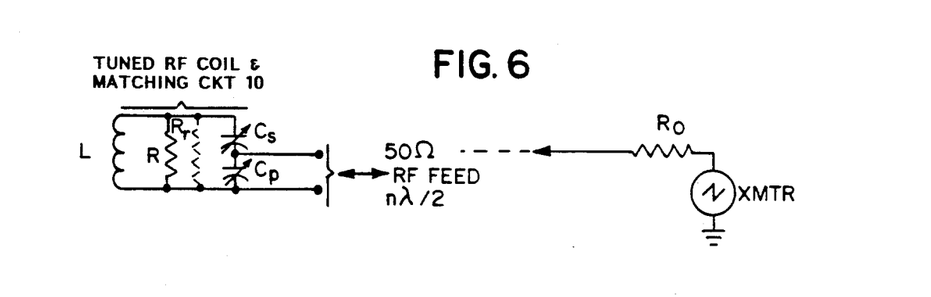
FIG. 6 is a more detailed schematic diagram of another example of the embodiment shown in FIG. 1.

An alternative exemplary equivalent circuit 10 is depicted in FIG. 6. Again, the parallel resistance R is the equivalent parallel resistance of the coil (e.g., 10,000 ohms) associated with its intrinsic Q. The equivalent tuning and matching capacitances $C_s$ and $C_p$ are also depicted in FIG. 6.

As depicted in FIG. 6, a reflected resistance $R_r$ is effectively added in parallel with the resistance R. As will be appreciated upon analysis, when a matched impedance feed network is connected, $R_r$ is essentially equal to R thus effectively halving the intrinsic Q of the RF coil circuit. When matched impedance feed circuits are used in conjunction with the RF coil tuning/matching circuits, this then is the normal or nominal maximum effective Q of the coil. Although the equations for matched impedance and mismatched impedance conditions for this equivalent circuit are considerably more complex than those discussed above for the FIG. 2 equivalent circuit, we have been able to show that the equivalent results can be derived.

For example, using a computer simulation for $f_o = 15$ MHz, L=1 $\mu$H, R=10,000 $\Omega$, $C_p$=1577.9 pf and $C_s$=121 pf, Table 2 shows the results for terminating resistance from 0.01 to 9900 $\Omega$:

TABLE 2

| $R_o$ | $Z_{real}$ | Center f | −3db Low f | −3db High f | Δ | Q |
|---|---|---|---|---|---|---|
| 0.01 | 9873 | 14.46 | 14.395 | 14.53 | .135 | 107 |
| 0.05 | 9423 | 14.46 | 14.39 | 14.53 | .14 | 103 |
| 0.1 | 8915 | 14.46 | 14.39 | 14.535 | .145 | 99.7 |
| 0.5 | 6235 | 14.465 | 14.36 | 14.57 | .210 | 68.8 |
| 1.0 | 4577 | 14.47 | 14.33 | 14.62 | .290 | 49.9 |
| 2.0 | 3103 | 14.50 | 14.29 | 14.72 | .43 | 33.7 |
| 5.0 | 2059 | 14.65 | 14.33 | 14.99 | .660 | 22.1 |
| 10 | 2159 | 14.84 | 14.52 | 15.17 | .65 | 22.8 |
| 25 | 3435 | 14.97 | 14.77 | 15.18 | .410 | 36.5 |
| 50 | 4998 | 15.00 | 14.86 | 15.4 | .28 | 53.6 |
| 75 | 5979 | 15.00 | 14.89 | 15.12 | .23 | 65.2 |
| 100 | 6639 | 15.00 | 14.895 | 15.11 | .215 | 69.7 |
| 200 | 7966 | 15.00 | 14.915 | 15.09 | .175 | 85.7 |
| 500 | 9061 | 15.00 | 14.93 | 15.08 | .15 | 100 |
| 1000 | 9407 | 15.00 | 14.93 | 15.08 | .15 | 100 |
| 10000 | 9738 | 15.00 | 14.93 | 15.08 | .15 | 100 |

Figure 7:
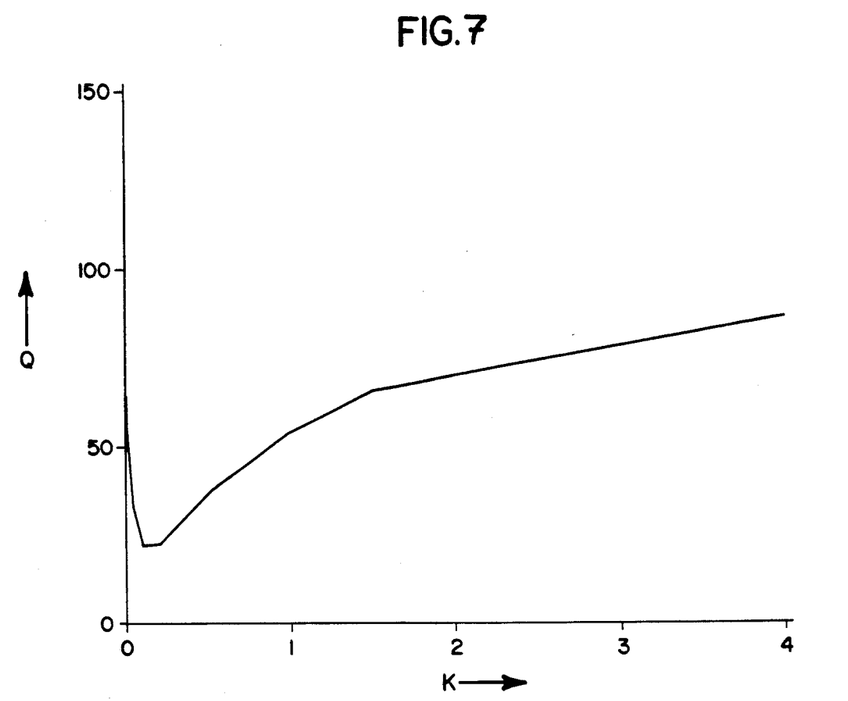
FIGS. 7-8 are plots of the Q for the FIG. 6 circuit as a function of an impedance mismatch factor k.
Figure 8:
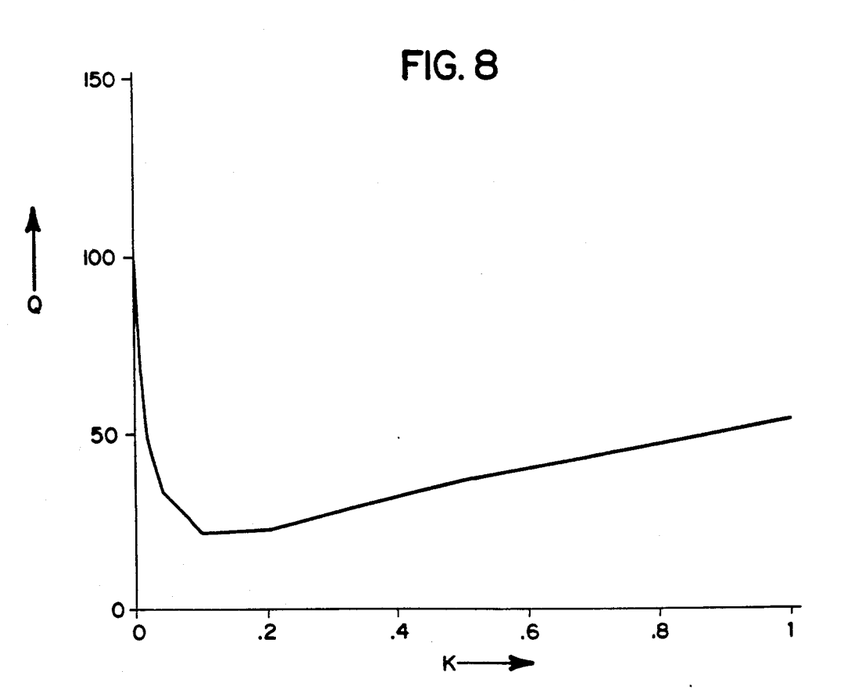

In this FIG. 6 circuit the minimum Q is 22.1, about 1/5th the unloaded Q when k=0.1. FIGS. 7 and 8 show Q for a range of k values. Q is half the unloaded value with a terminating resistance of about 1 $\Omega$ in addition to the 50 $\Omega$ case.

The circuit of FIG. 2 has the advantage of a larger Q reduction with a greater k factor.

Thus, if a substantially mismatched impedance is used (e.g., larger or smaller than the matched resistance) the effective Q of the coil can be lowered or raised above the nominal effective value of Q/2. As will be apparent to those in the art, the effective source resistance of RF transmitter and/or receiver circuits can be designed (using conventional techniques) so as to be either above or below the nominal characteristic impedance of the transmission line so as to provide a practical implementation of these circuits using conventional techniques which need not be explained in further detail.

As also depicted in FIG. 6, the nominal 50 ohm transmission line in this embodiment is selected so as to have a length that is an integer number of half wave-lengths. As will be appreciated by those in the art, normal Smith chart analysis of a transmission line (or transmission line equations) can be used to show that the RF impedance of a mismatched transmission line repeats cyclically every half wavelength. Thus, by arranging to have the transmission line substantially an integer multiple of half wavelengths, the modified source impedance of the transmitter/receiver circuits is effectively translated or reflected onto the input terminals of the matching circuit 10 of RF coil.

Figure 9:
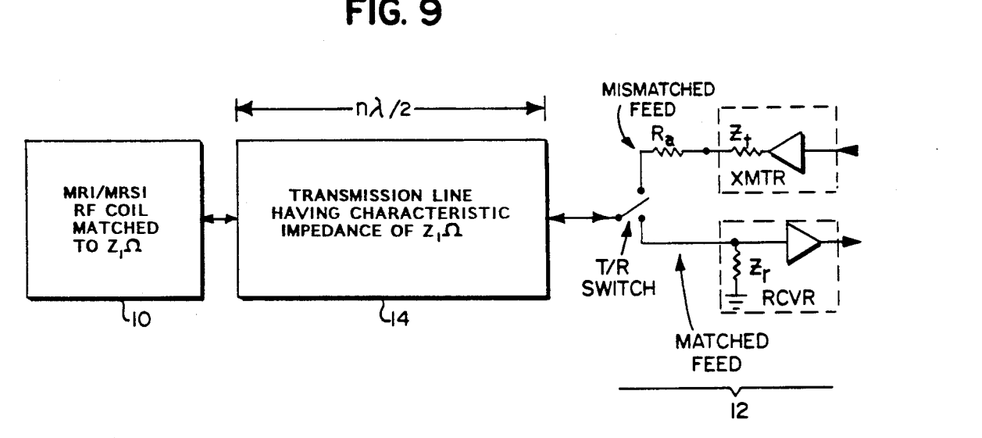
FIGS. 9-11 are block diagrams of yet further examples of the embodiment shown in FIG. 1.

This same general arrangement is depicted in FIG. 9 including a transmit/receive switch or alternate connection to mismatched feed networks associated with the RF transmitter and/or receiver circuits. For example, the intrinsic source impedance $Z_t$ of the transmitter and/or $Z_r$ of the receiver may itself be mismatched to the characteristic impedance $Z_1$ of the transmission line 14. Alternatively (or in addition), additional source impedance $R_a$ may be added to achieve a mismatch.

Figure 10:
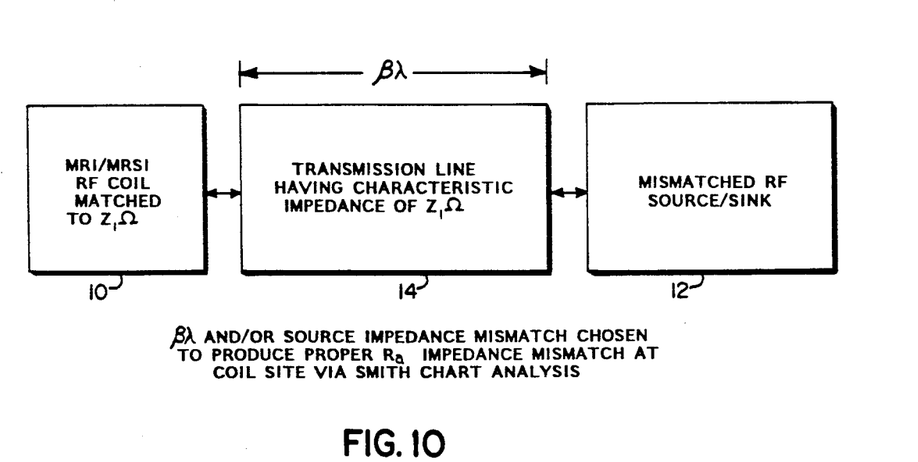

Yet another embodiment is depicted in FIG. 10 wherein the transmission line 14 does not have length substantially equal to an integer multiple of half wavelengths. Rather, in the embodiment of FIG. 10, the length of the transmission line is chosen using a Smith chart and/or the usual transmission line equations so as to achieve the desired terminal impedance at the coil site.

Figure 11:
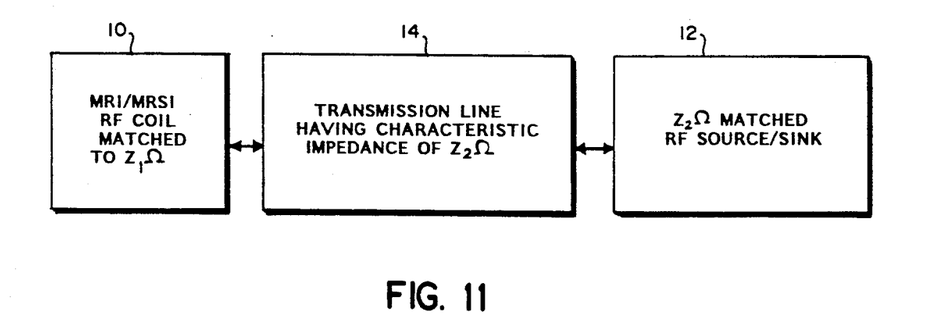

Yet another possible embodiment is depicted in FIG. 11. Here, the characteristic impedance $Z_2$ of the transmission 14 is properly matched to the characteristic source impedance $Z_2$ of the source and/or sink 12. However, the matching circuits 10 of the RF coil are matched not to $Z_2$ but, rather, to $Z_1$. Thus, in the embodiment of FIG. 11, the mismatch occurs at the situs of the RF coil and its tuning/matching circuits 10.

The effect on the Q of a coil (in terms of the intrinsic Q) caused by creating an impedance mismatch using resistor $R_a$ within a system that is otherwise designed for matched impedance RF feeds of 50 ohms is depicted as modified k values in FIGS. 4, 5, 7 and 8. Thus, when the nominally matched impedance condition, corresponding to $R_a=0$, prevails throughout the RF feed network, the intrinsic or maximum Q of the RF coil is effectively reduced in half. However, as impedance mismatches occur, the effective Q of the coil is reduced or increased. It may sometimes be desirable to effectively have a very low mismatched source resistance $Z_r$ for the receiver circuits and a very high mismatched source impedance $Z_t$ for the transmitter circuits. As earlier noted, maximum signal-to-noise ratio in the receiver circuits occurs when the noise impedance is matched and this may, in fact, be made to correspond to a mismatch of the transmission line impedance directly (e.g., in the absence of further matching circuits).

As should be appreciated, the mismatch in impedance may take on complex values. For example, at an assumed frequency of 2.16 MHz and a 50 ohm coaxial cable length of 12.8 feet, if an effective source impedance $Z_s$ of 76-j145.1 is effected (by suitable conventional circuit design at the transmitter and/or receiver circuits), then substantially only a resistance impedance of about 390 ohms is effectively translated or reflected to the coil site for connection to the RF coil matching circuits. This can be verified using a Smith chart or conventional transmission line equations.

Figure 12:
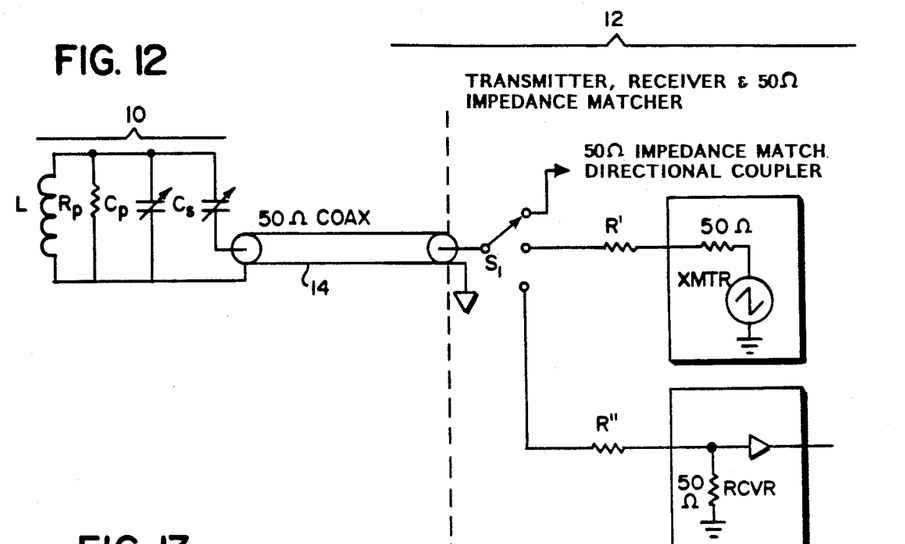
FIGS. 12-14 are schematic depictions of the FIGS. 7-10 embodiments illustrating initial impedance match adjusting circuits and techniques used to ultimately produce the requisite controlled impedance mismatch during actual transmit and/or receive operations.

Referring to the embodiment in FIG. 12, with the switch $S_1$ in the upper position as shown, a conventional directional coupler may be used to permit conventional tuning of the parallel tuning capacitance $C_p$ and the series matching capacitance $C_s$ so as to provide a matched impedance condition with respect to the 50 ohm coaxial cable transmission line 14. Thereafter, this initial setup procedure for obtaining a nominally matched impedance condition is altered for the actual transmit and receive circuits utilized in the next two positions of switch $S_1$ (i.e., non-matched impedance conditions). For example, in the middle or "transmit" switch position, R' is connected in series with the transmitter circuits so as to effectively reduce the Q (and increase the bandwidth) of the coil assembly 10. The added source resistance R' does dissipate power—but it provides better (i.e., more uniform) radiation of slices spatially located at the edges of a multi-slice imaged volume in an MRI/MRSI system. This technique is especially useful for lower frequency imagers (e.g., those using lower strength permanent magnets) so as to increase the number of slices that may be processed in a multi-slice procedure.

With the switch $S_1$ in the lower most position for receive MRI/MRSI processes, the resistance R'' connected in series with the preamplifier also reduces the effective Q of the receiving coil circuit and reduces the available signal-to-noise ratio. Nevertheless, such an increase in receive bandwidth may be desirable for echo-planar imaging (albeit not at low field, low frequency MRI/MRSI applications using multi-slice spin echo procedures). Cooling R'' with liquid nitrogen or helium may also reduce the added thermal noise and bring back part of the lost signal-to-noise ratio.

If R'' is made negative it increases the effective Q of the receiving coil circuit. Since this is merely a way to model a decrease in the input resistance of the receiver, the signal-to-noise ratio will depend on the noise matching of the receiver.

Figure 13:
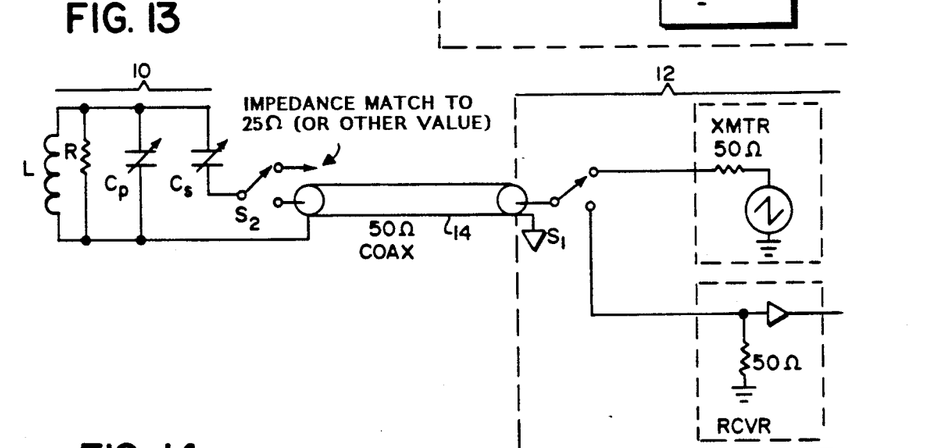

Using the mismatched impedance embodiment of FIG. 11 may complicate the initial impedance matching setup processes and one possible solution is depicted at FIG. 13. Here, the transmission line 14 is matched to the transmitter and receiver circuits 12. To achieve the desired impedance mismatch at the situs of the RF coil "match" circuits, these matching circuits 10 must at least initially be tuned so as to match to some other nominal impedance value. Accordingly, an initial setup switch $S_2$ may be provided so that the coil assembly may be initially matched to some other nominal impedance (e.g., 25 ohms or some other low value). If the coaxial transmission line 14 has an arbitrary length, then this nominal impedance matching measurement must be made at the coil connection point to the impedance matching capacitance $C_s$. In this sort of embodiment, both the receiver and transmitter circuits would effectively have the same reduced or increased Q value (rather than possibly different Q values as selected by R' and R''). Of course, a further resistor connected in series with either the receiver or transmitter circuits could provide additional Q reduction in conjunction with some mismatch on the coaxial cable as well. In other words, the embodiments of FIG. 11 and other figures might be partially combined.

Figure 14:
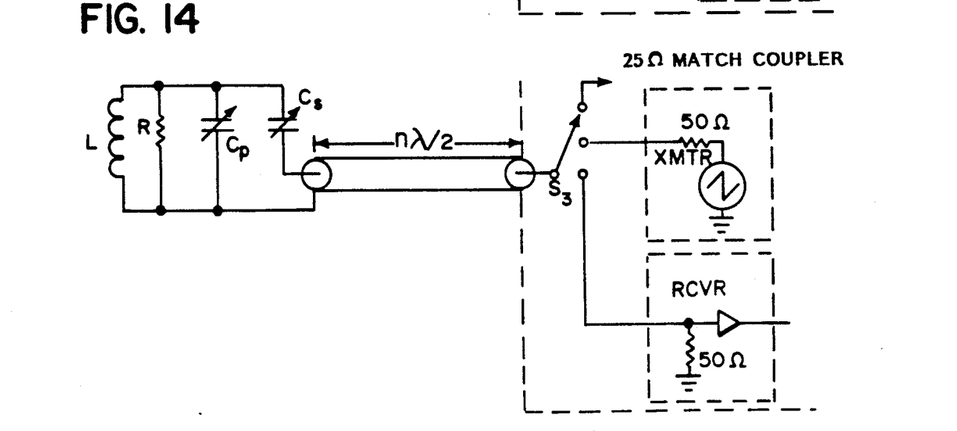

On the other hand, if the length of the transmission line 14 is chosen to be some integer number of half wavelengths, then the lowered "matching" impedance (e.g., 25 ohms) will also appear at the remote end of the cable and, as depicted in FIG. 14, a switch $S_3$ may be used so as to permit an initial impedance "matching" adjustment of $C_s$ with respect to a remotely located lowered impedance coupler (e.g., 25 ohms). Otherwise, the embodiment of FIG. 14 is similar to that of FIG. 13. And, as should now be apparent, if the length of the coaxial cable 14 is at some other known length, then an appropriate calculation (e.g., using conventional transmission line formulae and/or Smith charts) can be utilized so as to obtain the desired impedance mismatch using a complex-valued source impedance properly reflected back through the transmission line medium.

Although only a few exemplary embodiments of this invention have been described in detail, those skilled in the art will recognize that many variations and modifications may be made while yet retaining many of the novel features and advantages of this invention. Accordingly, all such variations and modifications are intended to be included within the scope of the appended claims.

We claim:

1. In an MRI/MRSI system, a method for controlling the quality factor Q of an RF coil and its capacitively coupled tuning and impedance matching circuits when connected to an impedance associated with MRI/MRSI RF signals, said method comprising the step of:

effecting an impedance mismatch in the resistive or real part of the impedance of an MRI/MRSI RF circuit capacitively coupling MRI/MRSI RF signals with said matching circuit so as to impose a selectively controlled mismatched value of load impedance across the RF coil.

2. An improved MRI/MRSI imaging system having an RF coil with a capacitively coupled tuning and matching circuit adjusted to match a characteristic RF source/feed impedance Z1 associated with MRI/MRSI signals, said improvement comprising:

an RF impedance substantially different than Z1 coupled as a source/feed impedance to said tuning and matching circuit.

3. An improved MRI/MRSI imaging system as in claim 2 wherein said RF coil is used only for transmitting RF signals into an object to be imaged and wherein said RF impedance is connected constantly during operation of said imaging system.

4. An improved MRI/MRSI imaging system as in claim 2 wherein said RF impedance is realized by a mismatched impedance between RF circuits feeding RF signals to/from said coil.

5. An improved MRI/MRSI imaging system as in claim 4 wherein said RF impedance is added to the remotely located source impedance of RF transmitter/receiver circuits and reflected to the site of said coil via an RF transmission line.

6. An improved MRI/MRSI imaging system as in claim 2 wherein said coil is used both to transmit RF signals into an object to be imaged and to receive RF signals therefrom, said improvement comprising:

an RF transmitter circuit having added source impedance with respect to a nominal $Z_1$ impedance;

an RF receiver circuit having reduced source impedance with respect to a nominal RF $Z_1$ impedance;

a transmit/receive switch connected to said RF transmitter and receiver circuits; and an RF transmission line having a characteristic impedance $Z_1$ connected at one end to said coil and at its other end to said switch for controllably changing the Q of said coil and circuits coupled thereto during RF transmit and RF receive functions of the coil.

7. An RF circuit for MRI/MRSI comprising:

an RF coil with tuning and impedance matching capacitances having an input/output impedance of $Z_1$ at resonant NMR frequency $f_o$, a transmission line capacitively coupled at one end to said RF coil; and RF transmit circuitry having a predetermined output impedance coupled to the other end of said transmission line;

the RF transmit circuitry having output impedance $Z_2$ which is translated to the RF coil via said transmission line as a value $Z_3$ substantially different than $Z_1$ and thereby supplying a de-Qing impedance load to said RF coil during transmission of RF signals.

8. An MRI/MRSI RF circuit as in claim 7 wherein:

the transmission line has a length of approximately an integer number of half wavelengths at frequency $f_o$, and $Z_2$ is substantially equal to $Z_3$ and different than $Z_1$.

9. An MRI/MRSI RF circuit as in claim 7 wherein:

the transmission line has a length substantially different from an integer number of half wavelengths at frequency $f_o$.

10. An MRI/MRSI RF circuit as in claim 9 wherein $Z_2$ is approximately equal to $Z_1$.

11. An MRI/MRSI RF circuit as in claim 7 wherein:

$Z_1$ is substantially less than $Z_2$, substantially less than $Z_3$ and also substantially less than the characteristic impedance of said transmission line.

12. An MRI/MRSI RF circuit as in claim 7 further comprising:

RF receive circuitry also coupled to the other end of said transmission line and having an input impedance $Z_4$ which, when translated to the RF coil via said transmission line becomes a value $Z_5$ substantially different than $Z_1$ and thereby supplying the Q-changing impedance load to said RF coil during reception of RF signals.

13. An MRI/MRSI RF circuit as in claim 12 wherein:

the transmission line has a length of approximately an integer number of half wavelengths at frequency $f_o$, $Z_2$ is substantially equal to $Z_3$ and different than $Z_1$; and $Z_4$ is substantially equal to $Z_5$ and different than $Z_1$.

14. An MRI/MRSI RF circuit as in claim 12 wherein:

the transmission line has a length substantially different from an integer number of half wavelengths at frequency $f_o$.

15. An MRI/MRSI RF circuit as in claim 14 wherein:

$Z_4$ is approximately equal to $Z_1$.

16. An improved MRI/MRSI imaging system as in claim 2 wherein said coil is used both to transmit RF signals into an object to be imaged and to receive RF signals therefrom, said improvement comprising:

an RF transmitter circuit having a first source impedance differing by a first amount with respect to a nominal $Z_1$ impedance;

an RF receiver circuit having a second source impedance differing by a second amount with respect to a nominal RF $Z_1$ impedance, said second amount being different than said first amount;

a transmit/receive switch connected to said RF transmitter and receiver circuits; and an RF transmission line having a characteristic impedance $Z_1$ connected at one end to said coil and at its other end to said switch for controllably changing the quality factor Q of said coil during RF transmit and RF receive functions of the coil.

* * * * *